(12) United States Patent
Aurongzeb et al.

(10) Patent No.: US 10,303,208 B2
(45) Date of Patent: May 28, 2019

(54) INFORMATION HANDLING SYSTEM FOLDED DISPLAY ASSEMBLY

(71) Applicant: Dell Products L.P., Round Rock, TX (US)

(72) Inventors: Deeder M. Aurongzeb, Austin, TX (US); Jason S. Morrison, Cedar Park, TX (US); Nicholas D. Abbatiello, Round Rock, TX (US)

(73) Assignee: Dell Products, Round Rock, TX (US)

( * ) Notice: Subject to any disclaimer, the term of this patent is extended or adjusted under 35 U.S.C. 154(b) by 0 days.

(21) Appl. No.: 16/046,040

(22) Filed: Jul. 26, 2018

(65) Prior Publication Data
US 2018/0329454 A1 Nov. 15, 2018

Related U.S. Application Data

(62) Division of application No. 14/954,062, filed on Nov. 30, 2015, now Pat. No. 10,078,347.

(51) Int. Cl.
G06F 1/16 (2006.01)
H01L 51/52 (2006.01)
H01L 51/56 (2006.01)
H01L 27/32 (2006.01)
G06F 11/32 (2006.01)

(52) U.S. Cl.
CPC .......... G06F 1/1616 (2013.01); G06F 1/1637 (2013.01); G06F 1/1643 (2013.01); G06F 1/1647 (2013.01); G06F 1/1656 (2013.01); G06F 11/325 (2013.01); H01L 27/32 (2013.01); H01L 51/5237 (2013.01); H01L 51/56 (2013.01); H01L 2251/5338 (2013.01)

(58) Field of Classification Search
CPC .... G06F 1/1616; G06F 1/1656; G06F 1/1637; H01L 27/32; H01L 51/56; H01L 51/5237; H01L 2251/5338

USPC .......... 361/679.01, 670.02, 679.04–679.09, 361/679.21, 679.22, 679.26–679.3, 361/679.55–679.6
See application file for complete search history.

(56) References Cited

U.S. PATENT DOCUMENTS 6,688,528 B2 12/2004 Silverbrook
2010/0117975 A1 5/2010 Cho
2011/0255000 A1* 10/2011 Weber .................... G03B 17/02
348/374

(Continued)

OTHER PUBLICATIONS

J. Hildebrand et al., Advanced analysis of laser beam polishing of quartz glass surfaces, LANE 2012. Physics Procedia 39 (2012) pp. 277-285 http://ac.els-cdn.com/S1875389212025667/1-s2.0-S1875389212025667-main.pdf?_tid=b6e180e8-9851-11e5-baeb-00000aab0f02&acdnat=1448991423_d836be4d75e9e7f13e6eea59cfc9887d.

Primary Examiner — Steven T Sawyer
Assistant Examiner — Sagar Shrestha
(74) Attorney, Agent, or Firm — Zagorin Cave LLP; Robert W. Holland

(57) ABSTRACT

A portable information handling system display has an OLED film disposed over front and rear faces of a substrate, such as a carbon fiber material. A protective cover is disposed over the OLED film with a folded portion along an end of the substrate, the protective cover hardened at the front and rear faces and left unhardened along the folded portion. In one example embodiment, a transparent bezel is placed over the folded portion with the OLED film presenting system information through the bezel, such as battery state, etc.

4 Claims, 5 Drawing Sheets

(56) References Cited

U.S. PATENT DOCUMENTS

| | | |
|---|---|---|
| 2012/0083401 A1 | 4/2012 | Koyama |
| 2013/0126874 A1 | 5/2013 | Jung et al. |
| 2013/0271697 A1* | 10/2013 | DeForest .......... G02F 1/133305 349/60 |
| 2014/0043755 A1* | 2/2014 | Sando ................ G06F 1/1626 361/679.56 |
| 2014/0370244 A1 | 12/2014 | Kinoshita |
| 2016/0081204 A1* | 3/2016 | Park ................... G06F 1/1652 361/807 |
| 2016/0143131 A1 | 5/2016 | Ahn |
| 2017/0034446 A1* | 2/2017 | Park ................... H04N 5/23293 |
| 2017/0126865 A1 | 5/2017 | Lee |
| 2017/0177035 A1 | 6/2017 | Song |
| 2017/0349473 A1 | 12/2017 | Moriya |

* cited by examiner

INFORMATION HANDLING SYSTEM FOLDED DISPLAY ASSEMBLY

CONTINUING DATA

This application is a divisional of co-pending application Ser. No. 14/954,062, filed Nov. 30, 2015, entitled "Information Handling System Folded Display Assembly," which is incorporated by reference in its entirety.

BACKGROUND OF THE INVENTION

Field of the Invention

The present invention relates in general to the field of information handling system housings to display visual images, and more particularly to an information handling system folded display assembly.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems conventionally present information as visual images at a liquid crystal display (LCD) that generally includes a touchscreen to accept inputs. LCD devices are built as flat panel assemblies that have a minimal thickness readily adaptable to low profile housings, such as planar housings used in tablet information handling systems and a lid portion of a clamshell or convertible housing used in laptop information handling systems. Generally, LCD devices present images by passing white light from a backlight through a panel of liquid crystal pixels that filter colors based on an electrical signal managed by a timing controller. For example, red, blue and green filters at each pixel are managed to pass light as a desired color. The thickness of the LCD panel is based upon the thickness of the liquid crystal portion and the backlight portion of the panel.

In order to further minimize the thickness of information handling system display panels, manufacturers have started to migrate to organic light-emitting diode (OLED) displays. OLED displays create images with a film of organic compound that emits light in response to an electric current, and thus reduce thickness by removing the need for a backlight. As an additional advantage, OLED display films are flexible so that a display may conform to a curved shape, such as folded around the edge of a housing. OLED displays that include a curved shape typically have a hardened outer surface to protect the film material from damage and to accept end user touches as inputs. One common protective outer coating is GORRILLA glass made by CORNING.

Although OLED displays provide a thinner solution for displays integrated into information handling system housings, OLED displays typically have to have some structural support to manage torsional stresses that can damage the display film or supporting circuits. The structural support tends to add thickness to the display and generally has to provide enough rigidity to endure user manipulations, such as opening and closing of a convertible information handling system housing lid portion. The outer protective surface of the display has to offer sufficient surface rigidity and protection against prevent scratches and damage to the display panel. Hardened glass covers for surface protection tend to be susceptible to cracking under torsional stress, even though the OLED display film itself can bend.

SUMMARY OF THE INVENTION

Therefore, a need has arisen for a system and method which provides an information handling system folded display assembly.

In accordance with the present invention, a system and method are provided which substantially reduce the disadvantages and problems associated with previous methods and systems for supporting a display having curved shape with a substrate and protective cover. A protective cover is hardened except at a portion that is masked. The portion that is masked avoids treatment and remains workable to fold into a folded portion aligned with a substrate edge. The folded portion covers OLED material folded over the substrate edge to provide presentation of images at the front and rear faces.

More specifically, a portable information handling system includes a processor and memory to generate visual information for presentation at a display as visual images. The display has an OLED film folded over a substrate material to present visual images at a front and rear face of the substrate with a portion of OLED film aligned along an edge of the substrate. A protective cover folds to couple over the front and rear faces with a folded portion of the protective cover disposed over the OLED film at the substrate edge. The protective cover is formed by masking an untreated glass sheet along the fold, treating the remainder of the glass sheet to harden the front and rear faces, then heating and bending the untreated portion that was masked to have a bend radius that matches the substrate edge. The protective cover couples over the substrate and OLED film to provide a hardened glass protective cover over the front and rear faces with a more flexible unhardened glass cover at the folded portion. A clear bezel placed over the folded portion provides for presentation of system information by the OLED display through the bezel.

The present invention provides a number of important technical advantages. One example of an important technical advantage is that an OLED display folds to present visual images on both sides of a housing portion, such as a convertible information handling system lid housing portion. Hardened glass left untreated at a bend radius provides improved response to torsion forces with the complete piece reducing manufacture assembly complexity relative to handling multiple pieces. The glass piece may be hardened and stored in a flat configuration for ease of manufacture and then bent at time of display assembly by heating an untreated portion of glass with a CO2 laser. Alternatively, separate front and back pieces of protective glass may be bridged together with optical adhesive or laser melting. An insert of laminated structure of carbon fiber or a magnesium lithium alloy disposed between the folded protective glass covers provides a rigid and lightweight support to hold the OLED display in place under the protective glass.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A protective glass cover for an information handling system display folds over an OLED film disposed on a substrate to present visual images on front and rear faces of the display. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
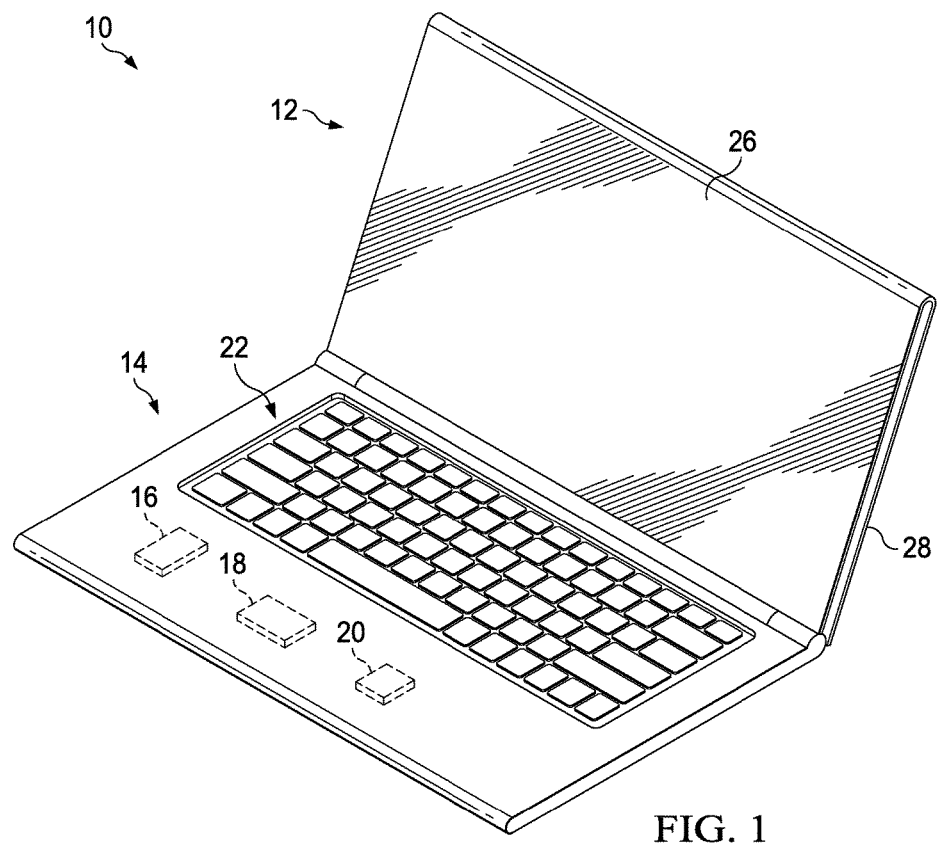
FIG. 1 depicts a portable information handling system in an open position configured to present images at front and rear faces.

Referring now to FIG. 1, a portable information handling system 10 is depicted in an open position configured to present images at front and rear faces of a display 24. In the example embodiment, portable information handling system 10 has a lid housing portion 12 rotationally coupled with a main housing portion 14, such as in a conventional laptop clamshell configuration. Main housing portion 14 includes processing components to process and store information, such as a central processing unit (CPU) 16, random access memory (RAM) 18 and a chipset 20 that includes firmware to manage interaction of components on a physical layer. A keyboard 22 covers the processing components and accepts end user inputs. Main housing portion 14 holds lid housing portion 12 in a viewing position so that an end user can see information presented as visual images at a display 24. Display 24 presents images at both a front face 26 and rear face 28 of lid housing portion 12.

Figure 2:
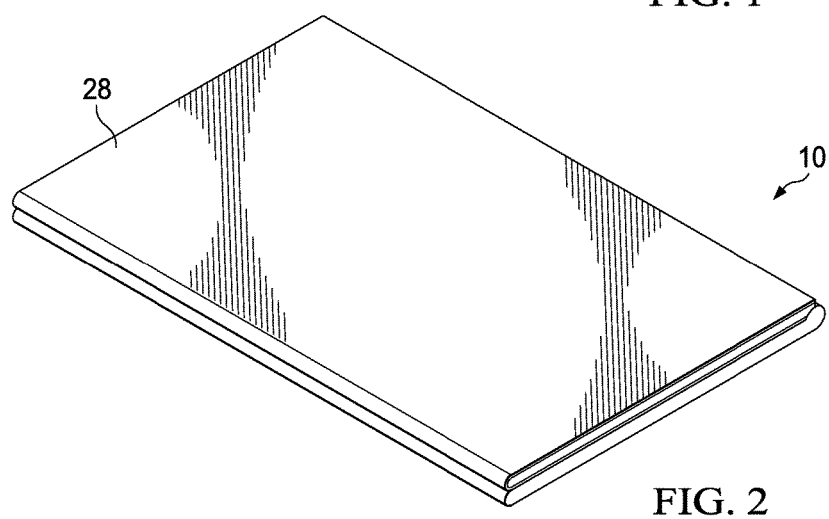
FIG. 2 depicts the portable information handling system in a closed position with the rear face exposed as a tablet configuration.

Referring now to FIG. 2, the portable information handling system 10 is depicted in a closed position with the rear face 28 exposed as a tablet configuration. An OLED film is disposed from front face 26 to rear face 28 by folding the OLED film over the edge of lid housing portion 12. Rear face 28 is exposed as a top cover of information handling system 10 to conveniently allow use as a tablet in the closed position; however, rear face 28 is also exposed to environmental damage that can cause scratches and breakage of the display cover placed over the OLED film. In addition, motion of lid housing portion 12 relative to main housing portion 14 can include torsional forces that twist display 24, resulting in cracking of protective covers that are built with hardness and stiffness to prevent impact damage and scratching. Although the example embodiment presents display 24 in a portable information handling system having a clamshell configuration, in alternative embodiments, alternative types of housing configurations may integrated folded displays having images presented at front and rear faces, such as tablet and smartphone configurations.

In the example embodiment, an OLED film folded over front face 26 and rear face 28 of lid housing portion 12 is protected with a transparent glass cover treated to have a hardness of 7H and associated high stiffness. For example, a protective cover of a GORRILLA glass treated 0.3 mm thickness of glass is placed over an OLED film to protect the film. Although treated glass is bendable, it generally cannot be thermoformed with high radius of curvature after hardness treatment and therefore is difficult to fold in a manner that will fit over the edge of display 24. In order to address this difficulty, a protective cover is formed to have a curved edge and less stiffness along the curved edge. In one embodiment, a flat glass sheet is masked at locations where a fold will be formed and then treated for hardness outside of the masked area so that the masked area remains formable. The mask is then removed, the glass is cut, and then the masked area is heat treated, such as with a CO2 laser to form to a pre-stressed shape that substantially conforms to the shape at the edge of lid housing portion 12. The pre-stressed glass form is laminated over a folded OLED film to couple the film and protective glass cover as a display assembly to lid housing portion 12. Since a bendable substrate will generally have some tension, a pre-stressed substrate is used for OLED so that tension is managed and decreased. The multilayer structure of the protective cover, OLED film and underlying lid substrate thus provides a rigid display having a high hardness glass cover in a low form factor display that responds to tension along the formed edge with less rigidity at the untreated portion of glass. In an alternative embodiment, a two-piece protective cover with a partial fold on each piece is bridged together with an optical adhesive, laser melting or other glass fretting operation. In various embodiments, lid housing portion 12 has a substrate that supports the OLED film of varying thickness based upon the size of the display and type of protective cover. For example, a carbon fiber laminate or a magnesium lithium alloy may be used to provide desired rigidity based on housing shape and size constraints.

Figure 3:
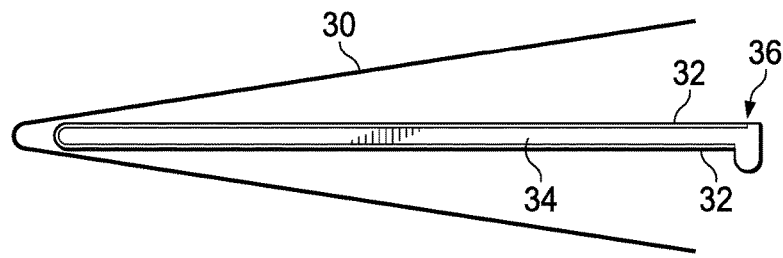
FIG. 3 depicts a side view of the portable information handling system with a protective glass cover align to couple into place over the front and rear faces.

Referring now to FIG. 3, a side view depicts the portable information handling system 10 with a protective glass cover 30 aligned to couple into place over the front and rear faces 26 and 28. An OLED film is disposed over a substrate support 34 to present information as visual images, such as with visual information provided through a hinge assembly 36. Protective cover 30 is, for example, 0.3 mm thick glass treated to have 7H hardness except at a folded portion that conforms to the edge between the front and rear faces. Support substrate 34 provides a frame for laminating OLED display film 32 and protective cover 30 to assemble a display unit. In one embodiment, support substrate 34 may include additional structures that provide support and rigidity as well as other functions, such as thin lithium ion battery cells disposed within a carbon fiber frame. In one example embodiment, a unidirectional fiber provides equal stiffness across the substrate structure, such as a UD+45 degree laminate insert disposed over a magnesium base. In alternative embodiments substrate 34 may comprise one or more of a composite or layered material having one or more of carbon fiber, Kevlar polymer mix or other similar materials.

Figure 4:
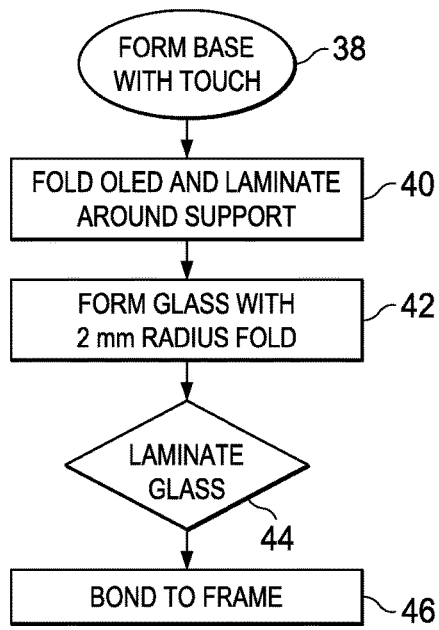
FIG. 4 depicts a flow diagram of a process for manufacture of a folded protective glass cover from a flat sheet of glass.

Referring now to FIG. 4, a flow diagram depicts a process for manufacture of a display as depicted by FIG. 3 having a folded protective glass cover formed from a flat sheet of glass. The process starts at step 38 with the formation of a substrate base adapted to accept an OLED film and glass protective material and having support for touch sense, such as to accept touch inputs at a touchscreen. At step 40, the OLED film and laminate are disposed around the support structure to define display area at the front and rear faces of the support substrate. At step 42, a protective glass cover is formed having a 2 mm radium fold that conforms to the edge of the support substrate 34. The initial glass structure is a flat plane that adapts well to a hardening treatment. The flat glass plane is masked at the location where the fold will take place, such as with a polymer cover that prevents effectiveness of the hardening treatment, and then hardening treatment is applied to harden the glass except at the masked areas. The protective glass is then heated along the untreated area to pull and bend the glass to the desired fold radius. At step 44, the protective glass cover is placed over the OLED film and substrate, and then laminated into place. At step 46, the display assembly is then bonded to the frame of the information handling system. In the example embodiment of FIG. 4, a 2 mm fold radius is depicted, however, the fold radius may vary based upon the size of the display and support substrate composition. For example, fold radii of 5, 10 and 12 mm may be used on seven and nine inch diagonal display devices. In various embodiments, the fold radius may range from 0.5 mm to 20 mm.

Figure 5:
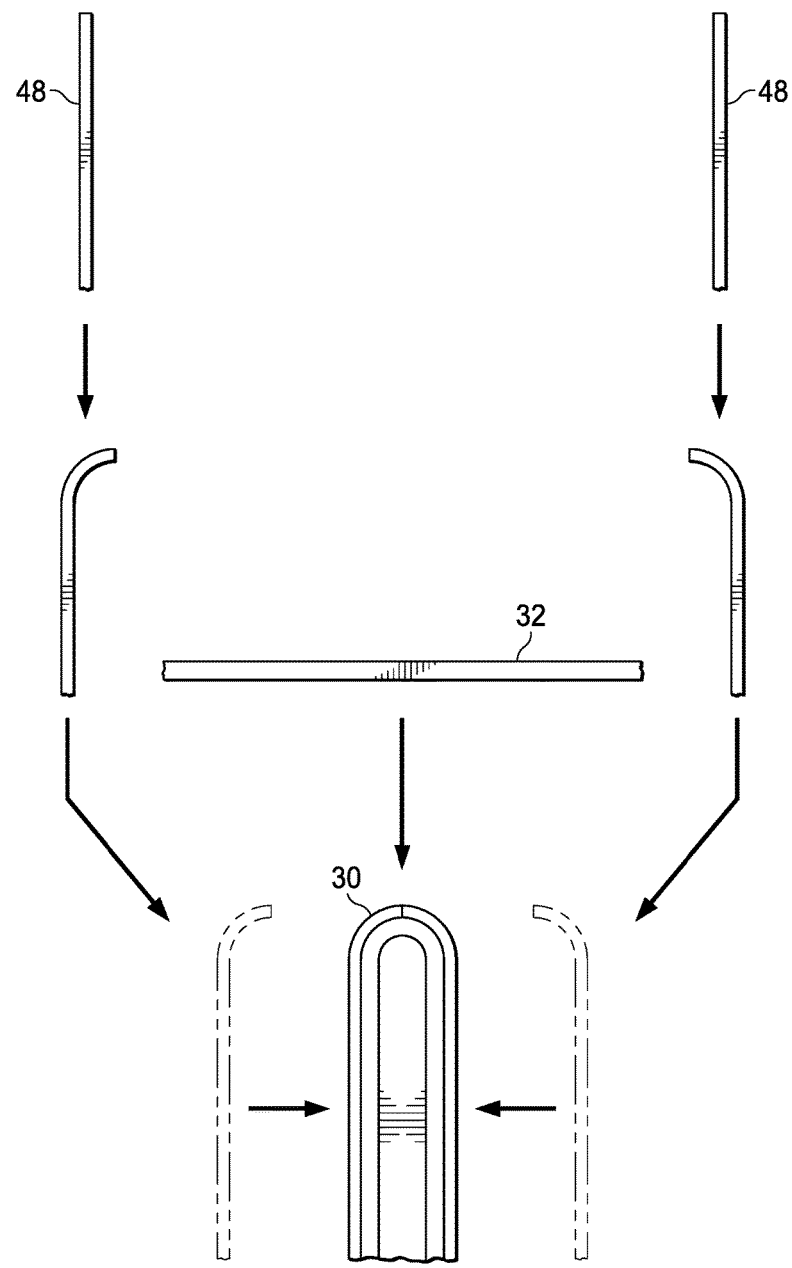
FIG. 5 depicts a side view of opposing protective covers aligned to couple to a display.

Referring now to FIG. 5, a side view depicts opposing protective covers 48 aligned to couple to a display OLED film 32. A pair of flat protective glass pieces is thermoformed or laser formed to have curved edges that conform to the shape of the substrate edge. The half-sheets of glass 48 may be treated for hardening after the forming of the fold or may mask the fold portion to restrict hardening treatment so that forming of the fold is performed after hardening treatment on an unhardened portion of each half sheet 48. Advantageously, masking a portion of glass where a fold is later to be formed allows large portions of glass to be treated at one time and then cut for use in displays. OLED film 32 is placed over a support substrate 34, such as a 0.04 mm composite material, and then each half-sheet of hardened glass 48 is placed over OLED film 32. The half-sheets of glass 48 are placed proximate to each other along the edge of substrate 34 and then bonded together, such as with optical adhesive, laser heating or glass fretting.

Figure 6:
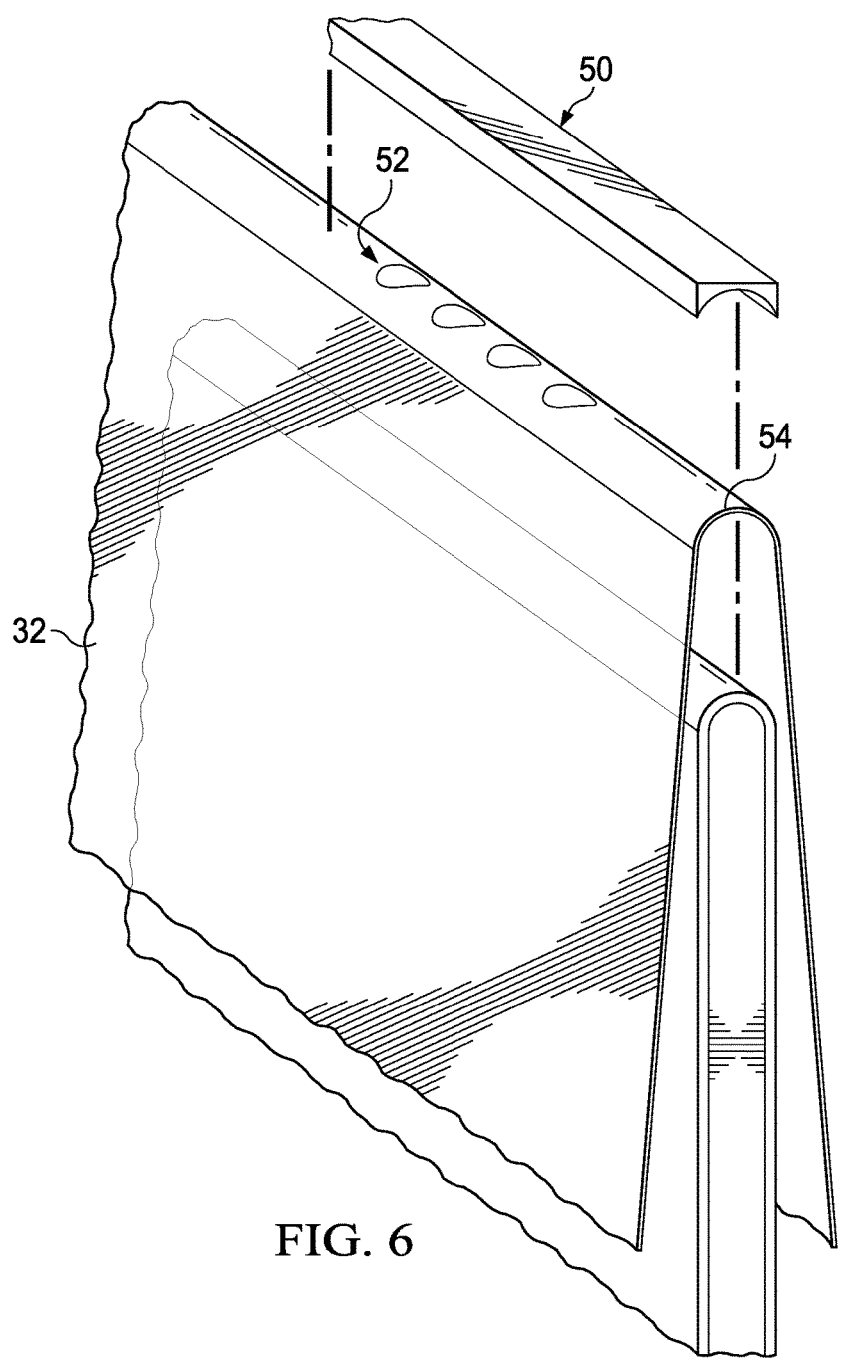
FIG. 6 depicts a side perspective view of a folded protective cover having an edge covered by a bezel and presenting system information displayed through the bezel.

Referring now to FIG. 6, a side perspective view depicts a folded protective cover 30 having an edge covered by a bezel 50 and presenting system information displayed through the bezel. In the example embodiment, substrate 48 supports an OLED film with protective glass 30 placed over the substrate and OLED film assembly. The folded portion 54 of protective glass 30 has some susceptibility to scratching or breaking where, for example, the folded portion was not treated for hardening or was formed with joined separate pieces of glass. A transparent bezel 50 placed over folded portion 54 allows presentation of a system status bar 52 at the folded portion of OLED film 32. For example, system status bar 52 presents status indicators for power, battery level, screen brightness, wireless networking and other system operation status factors. Bezel 50 protects weakened portions of protective glass cover 30 from damage caused by impact or scratches. In one alternative embodiment, folded portion 54 is separately treated for hardening after bending of folded portion so that bezel 50 can have a thinner form or be left off completely. In another alternative embodiment, transparent bezel 50 is a polymer layer disposed over protective cover 30.

Figure 7A:
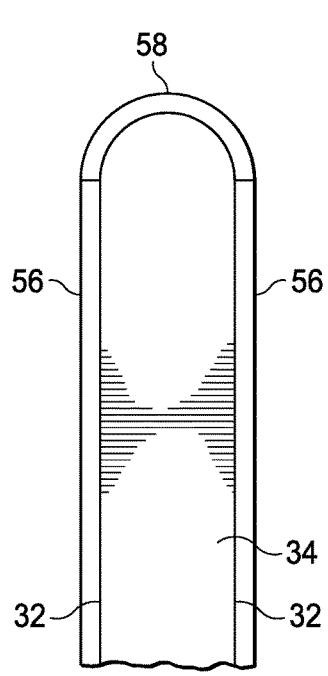
FIGS. 7A-7B depict a side view of a three piece protective cover for the display and edge portion.
Figure 7B:
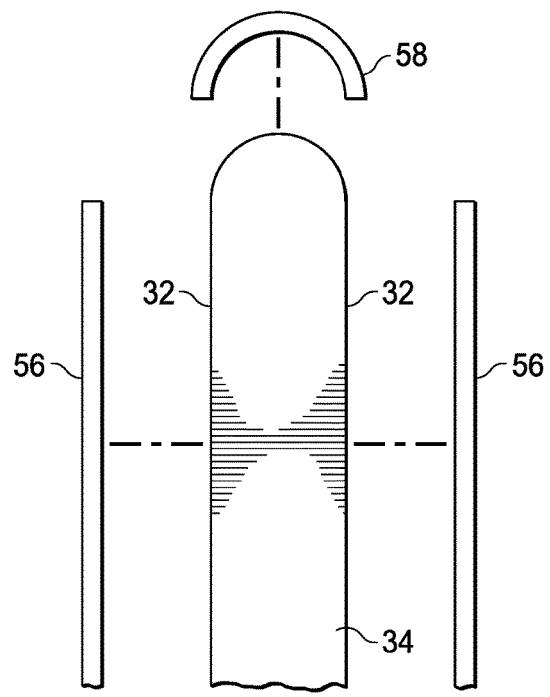

Referring now to FIG. 7 depicts a side view depicts a three piece protective cover for the display and edge portion. Two opposing flat side protective glass portions 56 couple to the front and rear sides of substrate 34. A formed protective glass cap couples to the edge of substrate 34 to protect the folded portion of OLED display film 32. The combined effect of the three protective portions is to provide a protective cover for the substrate with hardened glass. Flat sheets 56 are treated in large batches in an efficient manner. Formed protective cap 58 has a relatively small size that allows treatment of multiple pieces at a time. The three pieces are coupled together with glue, laser heating, fretting or other appropriate treatments.

Figure 8:
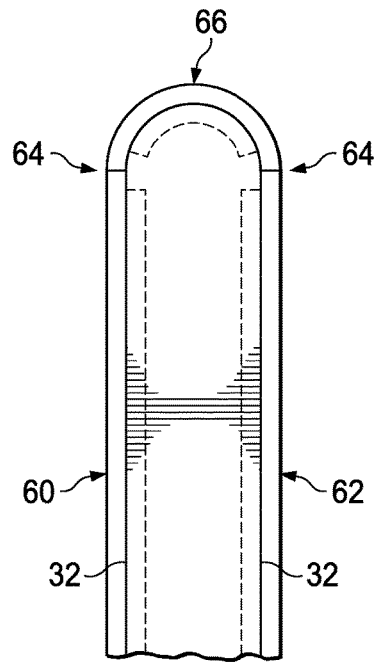
FIG. 8 depicts a side view of one example embodiment of the three piece protective cover and presentation of information from the display.

Referring now to FIG. 8 depicts a side view depicts one example embodiment of the three piece protective cover and presentation of information from the display. A front active viewing area 60 of display 32 is presented through the front protective glass 56. A rear active viewing area 62 is presented through the rear protective glass 56. An edge active viewing area 66 is presented through the formed portion of display 32. A black display area 64 is presented below the joining lines of the side and formed protective covers to help hide the seams formed between the three protective cover portions. For example, the black area 64 may be presented black by the display or be treated to have a black color. As set forth above, the formed portion of display 32 may be used to present system information and accept system inputs from a user, such as touches to turn the system on and off, changes to color and contrast, etc. . . .

Although the present invention has been described in detail, it should be understood that various changes, substitutions and alterations can be made hereto without departing from the spirit and scope of the invention as defined by the appended claims.

What is claimed is:

1. A method for assembly of a portable information handling system display, the method comprising:
- folding an OLED film around a substrate so that the OLED film covers a front and rear surface of the substrate;
- masking a portion of a protective cover;
- treating the protective cover, the treating hardening the protective cover, the masking preventing the treating of the portion;
- folding the protective over at the masked portion; and
- coupling the protective cover over the OLED film with the masked portion aligned along an edge of the substrate;
- attaching a bezel along the edge to cover the masked portion of the protective cover, the bezel comprising a transparent material; and
- presenting status information of the information handling system with the OLED display disposed below the bezel.

2. The method of claim 1 wherein folding the protective cover at the masked portion further comprises heating the masked portion with a CO2 laser.

3. The method of claim 1 further comprising treating the masked portion to harden the masked portion after the folding the protective cover.

4. The method of claim 1 further comprising inserting a battery in the substrate, the battery interfaced with a power system of the information handling system to power the information handling system.

* * * * *

UNITED STATES PATENT AND TRADEMARK OFFICE
CERTIFICATE OF CORRECTION

PATENT NO. : 10,303,208 B2
APPLICATION NO. : 16/046040
DATED : May 28, 2019
INVENTOR(S) : Deeder M. Aurongzeb, Jason S. Morrison and Nicholas D. Abbatiello Page 1 of 1

It is certified that error appears in the above-identified patent and that said Letters Patent is hereby corrected as shown below:

In the Claims

In Column 7, Line 11, Claim 1 please replace "over" with --cover--.

Signed and Sealed this
Tenth Day of September, 2019

Andrei Iancu
*Director of the United States Patent and Trademark Office*